(12) United States Patent
Eleftheriou et al.

(10) Patent No.: US 9,530,493 B2
(45) Date of Patent: *Dec. 27, 2016

(54) RESISTIVE RANDOM-ACCESS MEMORY CELLS

(71) Applicant: INTERNATIONAL BUSINESS MACHINES CORPORATION, Armonk, NY (US)

(72) Inventors: Evangelos S Eleftheriou, Zurich (CH); Daniel Krebs, Zurich (CH); Abu Sebastian, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/070,716

(22) Filed: Mar. 15, 2016

(65) Prior Publication Data

US 2016/0196874 A1 Jul. 7, 2016

Related U.S. Application Data

(63) Continuation of application No. 14/305,052, filed on Jun. 16, 2014, now Pat. No. 9,305,636.

(30) Foreign Application Priority Data

Jun. 28, 2013 (GB) .................................. 1311671.0

(51) Int. Cl.
*G11C 13/00* (2006.01)
*G11C 11/56* (2006.01)
(Continued)

(52) U.S. Cl.
CPC ........ *G11C 13/0011* (2013.01); *G11C 11/5614* (2013.01); *G11C 11/5685* (2013.01);
(Continued)

(58) Field of Classification Search
CPC ............. G11C 11/5614; G11C 11/5685; G11C 13/0002; G11C 13/0007; G11C 13/0069; G11C 2213/18; G11C 2213/35; G11C 2213/52; H01L 45/08; H01L 45/085; H01L 45/12; H01L 45/1226; H01L 45/1233; H01L 45/124; H01L 45/1253; H01L 45/16; H01L 27/2463
(Continued)

(56) References Cited

U.S. PATENT DOCUMENTS 8,362,454 B2 1/2013 Lee et al.
9,305,636 B2 * 4/2016 Eleftheriou ......... G11C 11/5614
(Continued)

FOREIGN PATENT DOCUMENTS

CN 1726602 A 1/2006
CN 101167188 A 4/2008
(Continued)

OTHER PUBLICATIONS

Liao et al., Chalcogenide phase change induced with single-wall carbon nanotube heaters, IEEE 2009 67th Annual Device Research Conference (DRC 2009), Jun. 22, 2009,pp. 239-240, <http://ieeexplore.ieee.org/stamp/stamp.jsp?tp=&arnumber=5354846/>.
(Continued)

*Primary Examiner* — Tan T Nguyen
(74) *Attorney, Agent, or Firm* — Mercedes Hobson

(57) ABSTRACT

Improved random-access memory cells, complementary cells, and memory devices. The present invention provides a RRAM cell for storing information in a plurality of programmable cell states. The RRAM cell includes: an electrically-insulating matrix located between a first electrode and a second electrode such that an electrically-conductive path, extending in a direction between said
(Continued)

electrodes, is formed within said matrix on application of a write voltage to said electrodes; an electrically-conductive component; wherein a resistance is presented by the electrically-conductive component; and wherein said RRAM is arranged such that said resistance is at least about that of said electrically-conductive path and at most about that of said electrically-insulating matrix in any of said plurality of programmable cell states.

20 Claims, 10 Drawing Sheets

(51) Int. Cl.
H01L 45/00 (2006.01)
H01L 27/24 (2006.01)
(52) U.S. Cl.
CPC ...... G11C 13/0002 (2013.01); G11C 13/0007 (2013.01); G11C 13/0069 (2013.01); H01L 27/2463 (2013.01); H01L 45/08 (2013.01); H01L 45/085 (2013.01); H01L 45/12 (2013.01); H01L 45/124 (2013.01); H01L 45/1226 (2013.01); H01L 45/1233 (2013.01); H01L 45/1253 (2013.01); H01L 45/16 (2013.01); G11C 2213/18 (2013.01); G11C 2213/35 (2013.01); G11C 2213/52 (2013.01)
(58) Field of Classification Search
USPC .................................... 365/148, 158, 163
See application file for complete search history.

(56) References Cited

U.S. PATENT DOCUMENTS

| | | |
|---|---|---|
| 2007/0246766 A1 | 10/2007 | Liu |
| 2008/0001137 A1 | 1/2008 | Kozicki et al. |
| 2010/0109085 A1 | 5/2010 | Kim et al. |
| 2010/0123542 A1 | 5/2010 | Vaithyanathan et al. |
| 2010/0193762 A1* | 8/2010 | Hsieh ............... H01L 45/085 365/148 |
| 2011/0012083 A1 | 1/2011 | Kee |
| 2011/0096589 A1 | 4/2011 | Bratkovski et al. |
| 2011/0315947 A1 | 12/2011 | Kozicki |
| 2012/0176831 A1 | 7/2012 | Xiao et al. |
| 2013/0010529 A1* | 1/2013 | Hayakawa ........... H01L 27/101 365/148 |
| 2014/0269004 A1* | 9/2014 | Pramanik ............ H01L 45/14 365/148 |
| 2014/0369113 A1* | 12/2014 | Krebs .............. G11C 13/0004 365/163 |

FOREIGN PATENT DOCUMENTS

| | | |
|---|---|---|
| GB | 2515100 A | 12/2014 |
| GB | 2515101 A | 12/2014 |
| WO | 2005093839 A2 | 10/2005 |
| WO | 2005093839 A3 | 10/2005 |
| WO | 2011143139 A1 | 11/2011 |

OTHER PUBLICATIONS

List of IBM Patents or Patent Applications Treated as Related.

Walczyk et al, "Impact of Temperature on the Resistive Switching Behavior of Embedded HfO2-Based RRAM Devices," IEEE Transactions on Electron Devices, vol. 58, No. 9, Sep. 2011.

Ielmini, "Modeling the Universal Set/Reset Characteristics of Bipolar Rram by Field- and Temperature-Driven Filament Growth," IEEE Transactions on Electron Devices, vol. 58, Issue 12, Dec. 2011.

* cited by examiner conductive-bridge RAM oxide RAM/ metal-oxide RAM carbon RAM

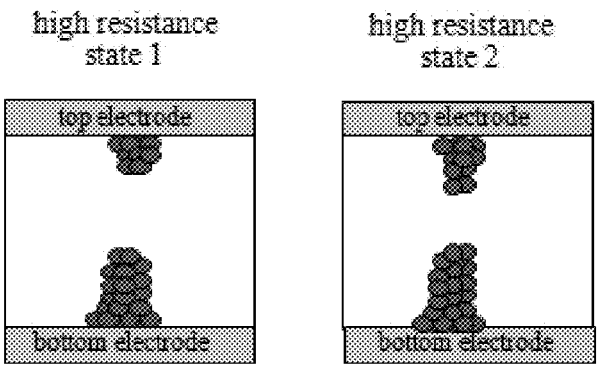
-PRIOR ART-
FIG. 2
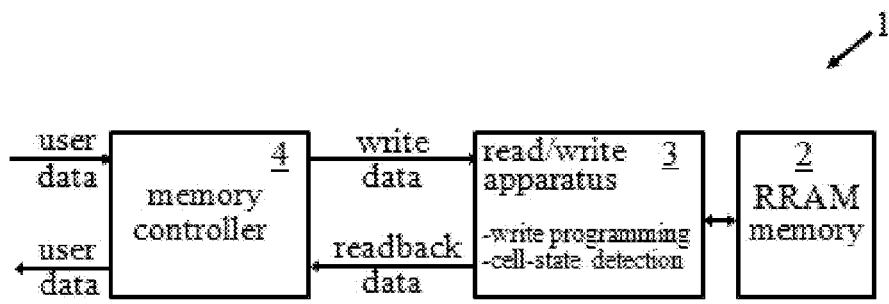
FIG. 3
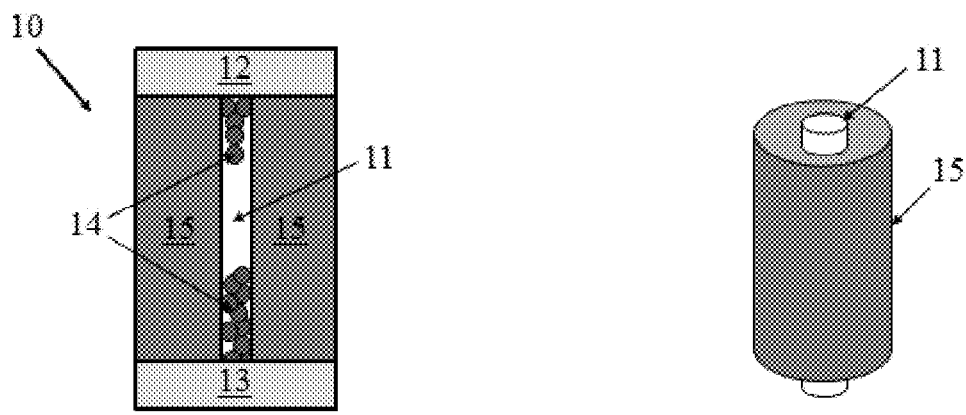
FIG. 4
FIG. 5

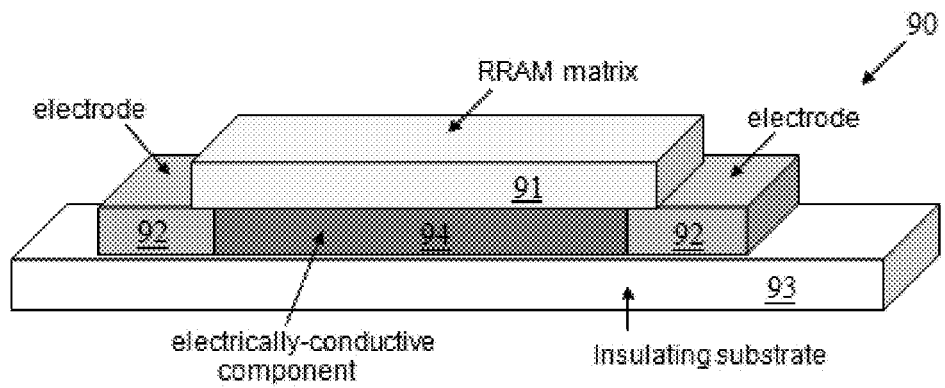
FIG. 20
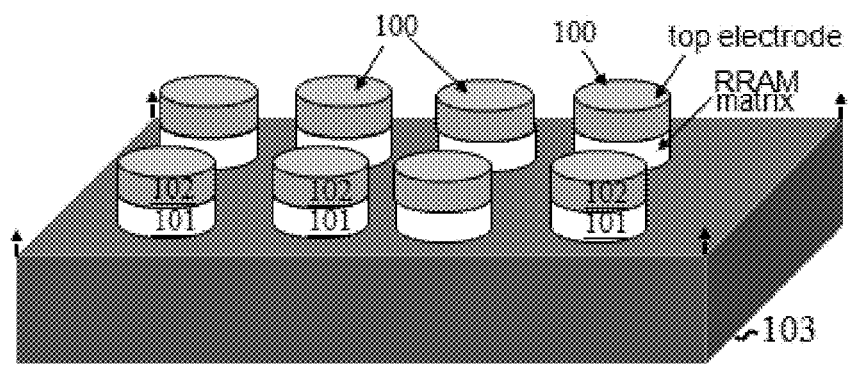
FIG. 21
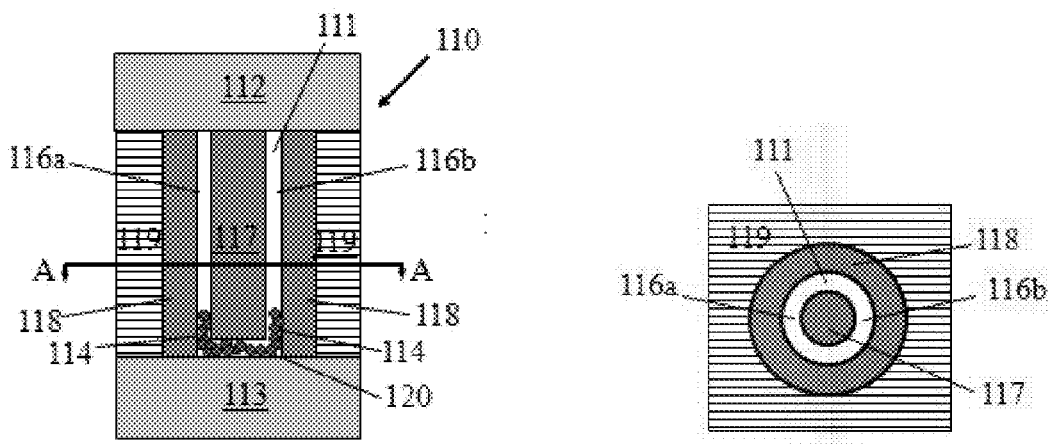
FIG. 22a
FIG. 22b

RESISTIVE RANDOM-ACCESS MEMORY CELLS

CROSS-REFERENCE TO RELATED APPLICATION

This application is a Continuation of U.S. patent application Ser. No. 14/305,052, filed on Jun. 16, 2014, which claims priority under 35 U.S.C. §119 from United Kingdom Patent Application No. 1311671.0 filed Jun. 28, 2013. The entire contents of both applications are incorporated herein by reference.

BACKGROUND OF THE INVENTION

This invention relates generally to resistive random-access memory cells.

Resistive random-access memory (RRAM) is a non-volatile memory technology in which the fundamental storage unit (the "cell") includes a RRAM material located between a pair of electrodes. The RRAM material in these cells is an electrically-insulating matrix which normally presents a high resistance to electric current. However, due to properties of the RRAM matrix or of the combination of matrix and electrode materials, it is a particular property of RRAM cells that an electrically-conductive path can be formed within the high-resistance matrix by application of a suitable voltage to the electrodes. This conductive path extends though the matrix in a direction between the electrodes.

When the path connects the two electrodes the resistance of the memory cell drops dramatically, leaving the cell in a low-resistance "SET" state. The conductive path can be broken or eliminated by application of another "RESET" voltage to the electrodes, returning the cell to the high-resistance RESET state. Hence by appropriate application of SET and RESET pulses in a data write operation, individual cells can be programmed into one of two states with measurably-different resistance values permitting storage of information with 1-bit per cell. The programmed cell state can be determined in a read operation using cell resistance as a metric for cell state. On application of a read voltage to the electrodes, the current which flows through the cell depends on the cell's resistance, whereby cell current can be measured to determine the cell state. The read voltage is significantly lower than the write voltage used for programming so that the read operation does not disturb the programmed cell state.

The conductive path can be formed by a number of different mechanisms in RRAM cells. This is illustrated schematically in FIGS. 1a to 1c of the accompanying drawings for different RRAM cell-types. FIG. 1a illustrates migration of metal ions from an active electrode (silver) towards an inactive electrode (platinum) through a high-resistance ion conducting layer providing the insulating matrix between the electrodes. The resulting metal filament provides the conductive path in this type of conductive-bridge RRAM cell. FIG. 1b illustrates conductive path formation in oxide RRAM and metal-oxide RRAM cells. Here the path is formed by oxygen vacancies or metal precipitates, respectively, resulting from migration of oxygen ions in the insulating matrix. FIG. 1c illustrates conductive path formation by graphene ($sp^2$) clusters in an amorphous carbon matrix disposed between top and bottom electrodes (e.g. of copper and titanium nitride, respectively) of a carbon RRAM cell.

In each case, the cell resistance decreases with increasing length of the conductive path across the insulating matrix. In general, the path "length" as used herein refers to effective path length corresponding to a particular configuration of the conductive path in the matrix. The nature of this conductive path as well as its configuration can vary across the variety of physical mechanisms exploited for path formation in RRAM devices, but different configurations equate to a different effective length of the conductive path. The path "length" as used herein can therefore correspond to an aggregate length if the path is fragmented, rather than continuous, and thus formed by two or more disconnected portions. Depending on cell-type, the RESET cell state can correspond to complete dissociation of the path-forming mechanisms, eliminating the path entirely, or only partial dissociation resulting in a gap or discontinuity in the path.

There are a number of problems associated with conventional RRAM technology. Switching between the SET and RESET states provides effective operation for two-state (or so-called "single-level") RRAM cells. However, realization of "multi-level" RRAM cells (i.e. cells with s>2 programmable states) is challenging. Multilevel operation requires use of two or more "high-resistance" programmed states in which the conductive path has different lengths but does not fully bridge the RRAM matrix. Two such states are illustrated schematically in FIG. 2 of the accompanying drawings. There is a difference of several orders of magnitude in the resistivities of the conductive path and the insulating matrix. As a consequence, it is difficult to distinguish between such different high-resistance states using standard sensing schemes because sensing very high resistance values is difficult at high bandwidth. In addition, the transport properties of RRAM cells are complex and not yet fully understood, so it is difficult to predict the operating characteristics with the accuracy necessary for reliable multilevel operation. Moreover, the resistance of the RRAM matrix material is subject to variability from cell to cell and subject to effects such as low-frequency noise and drift. Resistance drift causes the resistance of the insulating matrix of a given cell to increase in value over time. These effects cause the read measurements for high-resistance cell states to vary with time in a stochastic manner further complicating the task of cell-state detection on readback.

Another problem is that the RESET current is still prohibitively large in many RRAM technologies. The RESET current can be reduced by reducing the volume or increasing the resistivity of the insulating matrix. However, these measures compound the problem discussed above by increasing the resistance of the high-resistance cell states. It is then even more difficult to sense resistance values for these states with a reasonable sensing bandwidth. Another potential problem is so-called "thermal disturb." As dimensions are reduced for low technology nodes, heat generated during writing to one RRAM cell can disturb the programmed state in an adjacent memory cell.

A further problem is the occurrence of "sneak-path currents." These undesirable current paths can occur in passive cross-bar memory array architectures when cells in the SET state create a low-resistance current path during reading of a neighboring cell, causing connections between adjacent bit-lines or word-lines. This can make reading of the addressed cell difficult, leading to a wrong interpretation of the stored bit. To avoid this problem, an access device, such as a transistor, can be connected to each cell at the expense of increased circuit complexity and reduced storage density. An alternative approach, based on a "complementary resistive switch," is proposed in "Complementary resistive switches for passive nanocrossbar memories," Linn et al., Nature Materials, May 2010. Two bipolar cell elements A and B are connected antiserially into one complementary resistive switch (CRS) cell. The proposed cell has two programmable states, both being high-resistance state, corresponding to element A being in the low-resistance state and element B being in a high-resistance state and vice versa. Cell-state can be detected by determining whether the cell switches to a low-resistance ON state (high current) or remains in the high-resistance state (low current) on application of a read voltage. More recently, this 2-RRAM stack CRS cell concept was shown to work in single-stack bipolar RRAM devices ("Complementary switching in metal oxides: toward diode-less crossbar RRAMs," Nardi et al. IEDM 2011).

This single-stack cell has two high-resistance programmable states corresponding to the asymmetric RESET states obtained by applying different-polarity RESET pulses to the cell. In the first state, the conductive path has a longer portion near the one electrode than the other. This configuration is reversed in the other state so that the high-resistance "gap" in the conductive path is closer to a different electrode in each state. Cell-state can be detected by determining whether the cell switches to a low-resistance SET state on sweeping the voltage towards a positive or a negative polarity. While these complementary cell techniques avoid sneak-path currents, the read operation necessarily destroys the programmed cell state, requiring re-programming after reading.

Improved RRAM cells are desired.

SUMMARY OF THE INVENTION

Accordingly, one aspect of the present invention is a RRAM cell for storing information in a plurality of programmable cell states, the RRAM cell including: an electrically-insulating matrix located between a first electrode and a second electrode such that an electrically-conductive path, extending in a direction between the electrodes, is formed within the matrix on application of a write voltage to the electrodes; and an electrically-conductive component; wherein a resistance is presented by the electrically-conductive component; and wherein the RRAM is arranged such that the resistance is at least about that of the electrically-conductive path and at most about that of the electrically-insulating matrix in any of the plurality of programmable cell states.

Another aspect of the present invention is a complementary cell including: an at least two RRAM cells, wherein the at least two RRAM cells are connected antiserially and the electrically-conductive components of the at least two RRAM cells have a different electrical resistance: and wherein each the RRAM cell includes: an electrically-insulating matrix located between a first electrode and a second electrode such that an electrically-conductive path, extending in a direction between the electrodes, is formed within the matrix on application of a write voltage to the electrodes; and an electrically-conductive component; wherein a resistance is presented by the electrically-conductive component; and wherein each the RRAM is arranged such that the resistance is at least about that of the electrically-conductive path and at most about that of the electrically-insulating matrix in any of the plurality of programmable cell states.

Another aspect of the present invention is a memory device including: a read/write controller for reading and writing data in a plurality of RRAM cells; and wherein each the RRAM cell includes: an electrically-insulating matrix located between a first electrode and a second electrode such that an electrically-conductive path, extending in a direction between the electrodes, is formed within the matrix on application of a write voltage to the electrodes; and an electrically-conductive component; wherein a resistance is presented by the electrically-conductive component; and wherein each the RRAM is arranged such that the resistance is at least about that of the electrically-conductive path and at most about that of the electrically-insulating matrix in any of the plurality of programmable cell states.

Another aspect of the present invention is a method for forming a RRAM cell for storing information in a plurality of programmable cell states, the method including: forming a first electrode and a second electrode having an electrically-insulating matrix located therebetween such that an electrically-conductive path, extending in a direction between the electrodes, can be formed within the matrix on application of a write voltage to the electrodes; and forming an electrically-conductive component; wherein a resistance is presented by the electrically-conductive component; and wherein the RRAM is arranged such that the resistance is at least about that of the electrically-conductive path and at most about that of the electrically-insulating matrix in any of the plurality of programmable cell states.

BRIEF DESCRIPTION OF THE DRAWINGS

Preferred embodiments of the present invention are described by way of example with reference to the accompanying drawings.

FIG. 1a shows a conductive-bridge RAM;

FIG. 1b shows an oxide RAM/metal-oxide RAM; and

FIG. 1c shows a carbon RAM.

FIG. 2 illustrates a problem with known RRAM cells.

FIG. 3 is a schematic block diagram of a memory device according to an embodiment of the present invention.

FIG. 4 shows a first RRAM cell according to an embodiment of the present invention.

FIG. 5 illustrates part of the FIG. 4 cell structure according to an embodiment of the present invention.

FIG. 8a is a schematic illustration of the current/voltage characteristics of the material components of a typical cell; and FIG. 8b shows characteristic curves for two different cell states.

FIG. 11a is a schematic cross-sectional view of another RRAM cell according to an embodiment of the present invention; and FIG. 11b shows the corresponding arrangement for a cell in which the conductive path grows similarly from each electrode towards the other according to an embodiment of the present invention.

FIG. 18a illustrates another advantageous cell design according to an embodiment of the present invention; and FIG. 18b illustrates the complementary cell operation.

FIG. 20 illustrates another RRAM cell according to an embodiment of the present invention.

FIG. 21 indicates structure of an array of RRAM cells according to an embodiment of the present invention.

FIGS. 22a and 22b illustrate a further RRAM cell according to an embodiment of the present invention. More specifically:

FIG. 22a is a schematic cross-sectional view of the RRAM cell according to an embodiment of the present invention; and FIG. 22b is a schematic cross-section of A-A in FIG. 22a.

DETAILED DESCRIPTION OF THE PREFERRED EMBODIMENT

Figure 1A:
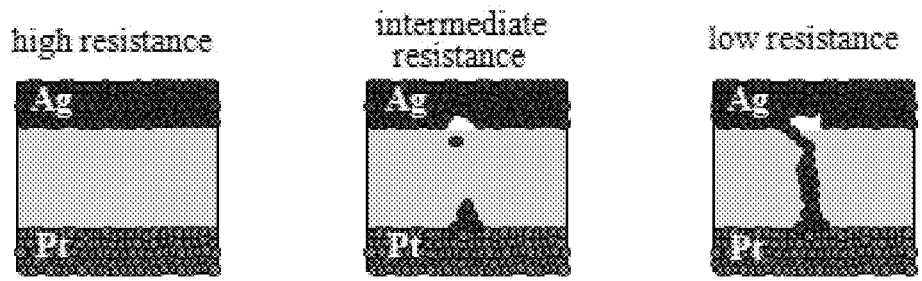
FIGS. 1a-1c show examples of known RRAM cells. More specifically.

An embodiment of a first aspect of the present invention provides a RRAM cell for storing information in a plurality of programmable cell states. The cell includes: an electrically-insulating matrix located between a first and a second electrode such that an electrically-conductive path, extending in a direction between the electrodes, can be formed within the matrix on application of a write voltage to the electrodes, the programmable cell states corresponding to respective configurations of the conductive path in the matrix; and an electrically-conductive component extending in a direction between the electrodes in contact with the insulating matrix; the arrangement being such that the resistance presented by the component to a cell current produced by a read voltage applied to the electrodes to read the programmed cell state is at least about that of the conductive path and at most about that of the insulating matrix in any of the cell states.

In RRAM cells embodying the present invention, the cell read current flows at least partially through the electrically-conductive component as well as or in preference to the insulating matrix in high-resistance cell states where the conductive path does not fully bridge the matrix to connect the electrodes. This can offer various advantages for cell operation. The resistance presented to the cell read current by the electrically-conductive component is preferably less than that of the insulating matrix and preferably also greater than that of the conductive path in any of the programmed cell states. Thus, according to embodiments of the present invention, cell read current primarily flows through the conductive path in preference to the electrically-conductive component and primarily through the electrically-conductive component in preference to the insulating matrix. The length, and hence resistance, of the current path through the electrically-conductive component depends on the length of the conductive path through the matrix and this can be varied for different programmed cell states. The overall cell resistance thus provides an effective cell-state metric as before, but this metric now depends on resistance of the current path through the electrically-conductive component as opposed to just resistance of the insulating matrix.

The adverse effects on read measurements of resistance drift and noise in the matrix is thus mitigated in cells embodying the present invention. Moreover, resistance values for high-resistance cell states are reduced by the presence of the electrically-conductive component. This facilitates read measurement and allows effective differentiation between different high-resistance cell states. Multilevel operation is thus eminently feasible with RRAM cells embodying the present invention, offering improvement in RRAM storage densities. The cell RESET current can also be reduced, permitting viable implementations of the various RRAM technologies and improving cell efficiency generally. Problems associated with reducing cell dimensions can also be significantly alleviated. In general, the features described offer very significant benefits for cell design by providing greater design flexibility, allowing cell dimensions to be reduced, and permitting realization of highly efficient cell designs. These and other advantages of embodiments of the present invention are discussed in more detail below.

The programmable cell states of RRAM cells embodying the present invention correspond to respective configurations of the conductive path in the insulating matrix. In some embodiments of the present invention a first RESET cell state can correspond to a configuration with no conductive path or an incomplete conductive path and a second SET state can correspond to a complete conductive path connecting the electrodes. Other cells can have s>2 programmable cell states for multilevel operation where the different states correspond to respective different (effective) lengths of the conductive path in the matrix. As mentioned previously, the conductive path may not be a continuous path and so the conductive path length can be an aggregate length for the component portions of a fragmented path.

In other embodiments of the present invention, the configuration of the conductive path in different cell states can differ in ways other than path length. For example, different states can have path configurations which result in substantially the same resistance of the RRAM element, but the overall cell resistance can differ due to appropriate design of the electrically-conductive component. In particular, the resistance per unit length of the electrically-conductive component can be varied in a direction between the electrodes to permit such cell states to be distinguished. One embodiment of the invention provides an improved complementary cell design which exploits this principle. In particular, a complementary memory cell embodying the present invention can be adapted to store information in a first cell state, in which the conductive path has a longer portion near the first electrode than the second electrode, and a second cell state, in which the conductive path has a longer portion near the second electrode than the first electrode. This can be achieved by applying programming pulses of opposite polarity to program the two cell states. In this cell, however, the resistance per unit length in a direction between the electrodes of the electrically-conductive component is greater near the first electrode than near the second. Since the conductive path in the two states has a longer portion (which can again be an aggregate length) near a different electrode, the high-resistance gap or discontinuity in the overall path is closer to one electrode than the other in each state. This difference can be detected in a read measurement because the read current flows primarily through the electrically-conductive component rather than the matrix material in the gap and this component has different resistances per unit length near the two electrodes. The measured cell resistance differs in the two cell states.

Such complementary cells can be used to avoid problems associated with sneak-path currents described earlier and do not require a "destructive read" to determine cell state. That is, cells can be read without disturbing the programmed state so there is no requirement for reprogramming after read operations. Other embodiments of the present invention provide a three-state RRAM cell based on the above complementary cell arrangement. Such a cell can be adapted for storing information in the first and second cell states described above and also a SET state in which the conductive path connects the electrodes.

Another complementary cell structure can be based on a pair of RRAM cells embodying the present invention. In particular, an embodiment of a second aspect of the present invention provides a complementary cell including two stacked RRAM cells according to the first aspect of the invention. The two RRAM cells are connected antiserially and the electrically-conductive components of the RRAM cells have different electrical resistance. The two RRAM cells can share a common electrode. With this design, the two high-resistance complementary cell states (in which a different one of the two RRAM cells is in the high-resistance state, the other being in the low-resistance state) can be differentiated due to the different resistance of the electrically-conductive components. This design again avoids sneak-path currents without requiring a destructive read to determine cell state.

In general, the extent of the insulating matrix in a direction between the electrodes is preferably greater than the thickness of the matrix perpendicular to that direction. Note that thickness of the matrix need not be constant over its extent. The matrix thus occupies a volume which is elongated in form, being longer in a direction between the electrodes than laterally. This can enhance operation and provides the basis for various preferred cell designs with reduced dimensions. In preferred embodiments of the present invention, the arrangement is such that the conductive path occupies at least about 10% of the thickness of the insulating matrix perpendicular to a direction between the electrodes. The arrangement is preferably such that the conductive path occupies the majority of the thickness of the insulating matrix perpendicular to a direction between the electrodes. In some embodiments of the present invention, the conductive path can have similar width to the matrix in a direction between the electrodes. Particular cell arrangements to satisfy such requirements depend on various factors such as cell type, the nature of the path-forming mechanism, and the electrode and matrix materials and dimensions.

The electrically-conductive component preferably extends substantially from one electrode to the other. When the component extends over the entire distance between the electrodes a full parallel current path is provided for optimal efficacy. In preferred cell designs the volume of the electrically-conductive component can be greater than about half that of the insulating matrix. The component volume is preferably approximately equal to or greater than the matrix volume and is most preferably greater than the matrix volume. Such embodiments offer efficient designs with a small matrix volume for reduced cell dimensions and improved operating efficiency as well as effective shielding by the electrically-conductive component even at high cell densities.

Advantageously, the resistance per unit length of the electrically-conductive component can vary in a direction between the electrodes so as to provide a desired cell operating characteristic. This can be achieved by varying the shape and/or resistivity of the component in the direction. The resistance of the current path through the electrically-conductive component thus varies in a non-linear manner with length of this current path and hence with length of the conductive path through the insulating matrix, and this variation is adapted to provide a desired characteristic in operation of the cell. Varying the resistance per unit length can produce a variety of effects on cell operation. This can be exploited to enhance operation in various ways as discussed further below.

The electrically-conductive component can include a layer of electrically-conductive material. The particular arrangement and thickness of this layer can vary considerably between different cell designs. In some preferred embodiments of the present invention the electrically-conductive component forms a sheath around the insulating matrix and the matrix can then form an elongated core within the sheath. In some embodiments the matrix core can include a nanowire. In other preferred embodiments, the cell can include a layer of the insulating matrix. The layer of electrically-conductive material can be disposed on at least one surface of the matrix layer. In other advantageous designs, the cell includes opposed layers of the insulating matrix extending in a direction between the electrodes, a core member extending in a direction between the electrodes in contact with respective inner surfaces of the opposed layers and an outer member extending in a direction between the electrodes in contact with respective outer surfaces of the opposed layers. The electrically-conductive component can include at least one of the core member and the outer member. The opposed layers of the insulating matrix preferably join to form an annulus around the core member. These various preferred arrangements permit exceptionally efficient cell designs with very small matrix volumes and/or high matrix resistance for reduced RESET current and low power consumption as well as other advantages discussed below.

An embodiment of a third aspect of the present invention provides a memory device including an array of cells according to embodiments of the first or second aspect of the present invention and a read/write apparatus for reading and writing data in the cells.

An embodiment of a fourth aspect of the present invention also provides a method for forming a RRAM cell for storing information in a plurality of programmable cell states. The method includes: forming first and second electrodes having an electrically-insulating matrix located therebetween such that an electrically-conductive path, extending in a direction between the electrodes, can be formed within the matrix on application of a write voltage to the electrodes, the programmable cell states corresponding to respective configurations of the conductive path in the matrix; and forming an electrically-conductive component; the method being performed such that the component extends in a direction between the electrodes in contact with the insulating matrix and the resistance presented by the component to a cell current produced by a read voltage applied to the electrodes to read the programmed cell state is at least about that of the conductive path and at most about that of the insulating matrix in any of the cell states.

In general, where features are described herein with reference to an embodiment of one aspect of the present invention, corresponding features can be provided in embodiments of another aspect of the invention as appropriate.

FIG. 3 is a simplified schematic of a RRAM memory device according to an embodiment of the present invention. The device 1 includes multilevel RRAM memory 2 for storing data in one or more integrated arrays of RRAM cells described below. Reading and writing of data to memory 2 is performed by read/write apparatus 3 under control of a memory controller 4. In general, the RRAM memory 2, read/write apparatus 3 and memory controller 4 can be implemented on the same chip or a plurality of chips. Read/write apparatus 3 includes circuitry of a generally known form for programming RRAM cells during data write operations and making read measurements for detecting cell state during data read operations. During these operations, the read/write apparatus can address individual RRAM cells by applying appropriate control signals to an array of word and bit lines in memory ensemble 2. Memory controller 4 provides general control of read/write operations to memory and typically performs various processing operations on data written to and read from the memory. For instance, user data input to device 1 is typically subjected to some form of write-processing, such as coding for error-correction purposes, before being supplied as write data to apparatus 3. Similarly, readback data output by apparatus 3 is generally processed, for example, for codeword detection and/or error correction in order to recover the original input user data. Memory controller 4 typically also implements additional functions, such as wear leveling, bad-block management, etc., as is apparent to those skilled in the art.

The RRAM cells of memory 2 can store information in s>2 programmable cell states providing multilevel operation. As discussed earlier, the s programmable cell states correspond to different configurations of the conductive path in the insulating RRAM matrix of the cell and thus to different values of the cell resistance. The s cell states are typically defined in apparatus 3 in terms of predetermined reference values or ranges of values of the resistance metric used for read detection. To program a cell in a write operation apparatus 3 applies a voltage to the cell via the word- and bit-lines such that the resulting programming pulse sets the cell to the required state. In a read operation a (lower) read voltage is applied to the cell and the resulting cell current is measured to obtain the resistance metric. Apparatus 3 can then detect the programmed cell state by comparing the read metric with the aforementioned reference values.

Figure 1B:
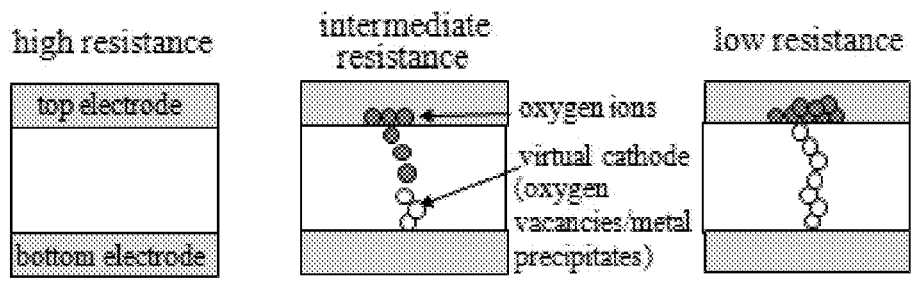
Figure 1C:
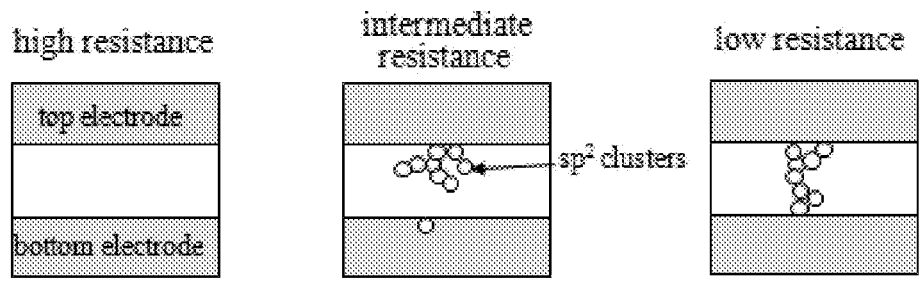

The following describes various embodiments of RRAM cells for use in memory 2 of device 1. The basic structure and operation of these embodiments of the present invention are described in general terms without limitation to any particular type of RRAM cell or conductive path-forming mechanism. In general, however, the embodiments described can be implemented in any type of RRAM cell wherein, by application of a suitable write voltage to the electrodes, a conductive path which extends generally in a direction between the electrodes can be formed within the electrically-insulating RRAM matrix of the cell. Such cells include conductive-bridge RRAM cells, carbon RRAM cells, and oxide or metal-oxide RRAM cells as exemplified in FIGS. 1a-1c. Subject to any requirements and/or preferred features discussed in the following, any suitable materials, structures, and arrangements for the electrodes and RRAM matrix components can be employed for implementing any embodiment as a particular type of RRAM cell and suitable options are readily apparent to those skilled in the art in any given case.

FIG. 4 is a schematic cross-sectional view of a first RRAM cell according to an embodiment of the present invention. The cell 10 has an electrically-insulating RRAM matrix material 11 located between the first and second electrodes, 12 and 13, for connecting the cell to the word and bit lines, respectively, of the cell array. Such electrodes can be referred to herein as a "top" electrode (TE) and a "bottom" electrode (BE) according to their arrangement in the figures, though no limitation is implied as to cell orientation in operation. The matrix 11 is shown in the figure containing a conductive path 14 which extends within the matrix 11 in a direction between the electrodes 12, 13. Cell 10 further includes an electrically-conductive component 15 which extends in a direction between the electrodes in contact with the matrix 11. As illustrated schematically in the partially cut-away view of FIG. 5, in this preferred embodiment of the present invention, component 15 includes a layer of electrically-conductive material which extends from one electrode to the other and all around the matrix 11. The matrix 11 forms an elongated core of material within the electrically-conductive layer 15 which itself forms a sheath around the matrix core. In this example, the sheath and core have a generally circular cross-section giving a cylindrical shape. In general, however, these elements can be formed with any desired cross-sectional shape. Cell 10 can be surrounded by an insulating layer (not shown) for electric and thermal insulation of the cell.

The RRAM core 11, in this embodiment, preferably has a thickness in the range of about 1 to 20 nm and a length in the range of about 5 to 100 nm. The electrically-conductive layer forming sheath 15 can be formed, for example, of TaN or TiN, and preferably has a thickness in the range of about 1 to 20 nm. The cell 10 can be fabricated using well-known material processing techniques for formation of the various elements of the cell. By way of example, the core and sheath structure can be produced by a keyhole-transfer process of the general type described in Raoux et al., IBM J. Res. & Dev. 52(4/5), 465 (2008), (see FIG. 6 thereof). In some implementations of this cell design, the matrix core can include a nanowire (including a nanotube or nanoribbon) of the matrix material. Such nanowires can be fabricated by well-known techniques. In these implementations, the cell structure can be fabricated from the core out by first forming the nanowire core and then depositing the electrically-conductive layer forming component 15 on the outer surface of the nanowire. The electrodes can be formed at any convenient stage of the processing operation.

Figure 6:
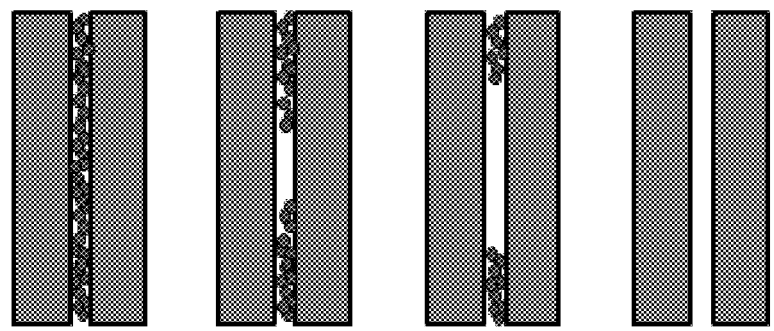
FIG. 6 illustrates cell configurations in different programmed cell states according to an embodiment of the present invention.

In general, the materials and dimensions of matrix 11 and component 15 are selected to satisfy particular resistance requirements. Specifically, the arrangement is such that the resistance presented by component 15 to a cell current produced by the read voltage for cells is greater than that of the conductive path 14 and less than that of the insulating matrix 11 in any of the s programmable cell states defined for multilevel operation. FIG. 6 is a schematic illustration of the configuration of the conductive path in the matrix in an exemplary cell with s=4 programmable states. The s states here correspond to respective different lengths of the conductive path 14 in the matrix 11. These states include a low-resistance SET state shown on the left of the figure, in which the conductive path extends fully through the matrix to connect the cell electrodes. The next three states, progressing from left to right, are successively higher-resistance states corresponding to decreasing (aggregate) length of the conductive path 14 in matrix 11. The highest-resistance cell state corresponds to substantially zero conductive path length in this example.

The cell arrangement here is assumed to be such that the conductive path grows similarly from each electrode towards the other in successive, increasingly less-resistive cell states. In other cells, however, the arrangement can be such that the conductive path grows substantially from one electrode towards the other in successive cell states. In general, either path-growth pattern can be achieved by appropriate engineering of the cell (e.g. by selecting cell-type and parameters such as materials, relative size, arrangement, thickness, conductivity, thermal conductivity, degree of inertness of the electrodes, etc.) as is apparent to those skilled in the art. In any case, in this highly efficient cell design, the thickness of the conductive path 14, perpendicular to a direction between the electrodes, is similar to that of the matrix 11, being at least about 80% of the core diameter.

Figure 7:
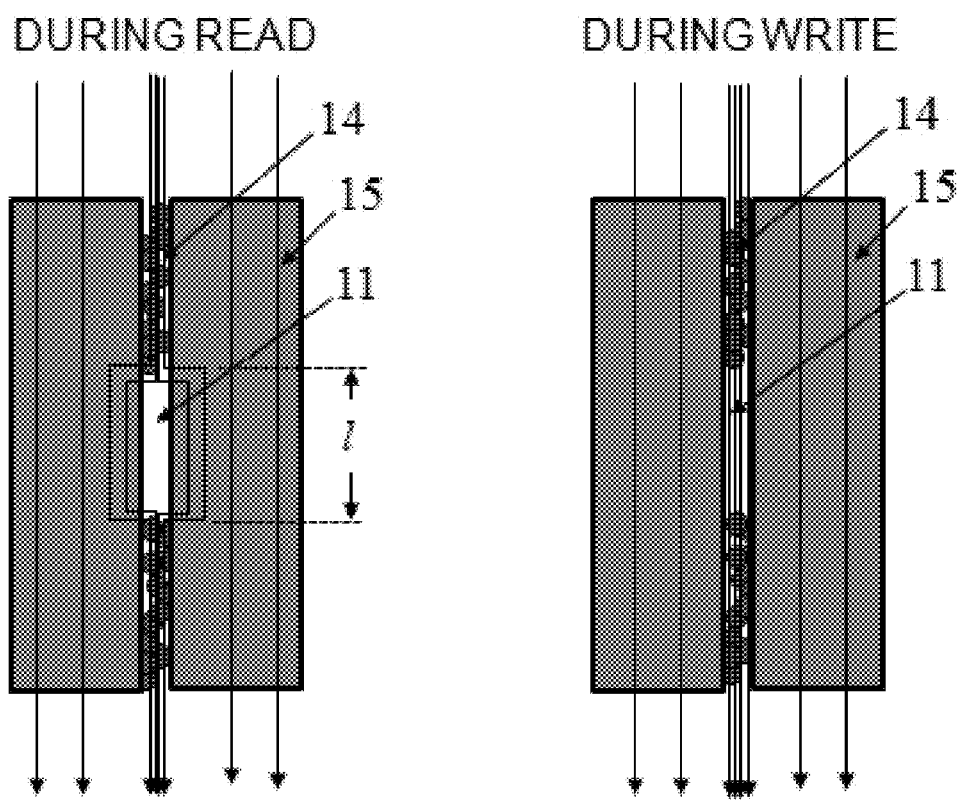
FIG. 7 indicates current flow in the FIG. 4 cell during read and write operations according to an embodiment of the present invention.

Because of the resistance constraints satisfied by conductive sheath 15, the sheath presents a lower-resistance current path to the cell read current than the matrix 11 in any programmed cell state and the length of this current path depends on the length of conductive path 14. FIG. 7 indicates current flow in cell 10 during read and write operations for a particular cell state. Current density is indicated schematically by spacing of the vertical arrows in the figure. Due to the resistance properties described above, in a read operation (as indicated on the left of the figure) the cell current flows primarily through the conductive path 14 in preference to the sheath 15, and primarily through sheath 15 in preference to the insulating matrix 11 occupying the "gap" in the conductive path. The resulting current path through the sheath 15 has a length l which is dependent on length of the conductive path 14, decreasing as the path length increases within the matrix. In a write operation, however, where a significantly higher voltage is applied between the cell electrodes, the cell current flows primarily through the core 11 as indicated on the right of the figure. The resistive properties which provide these effects can be understood from a consideration of FIGS. 8*a* and 8*b*.

Figure 8A:
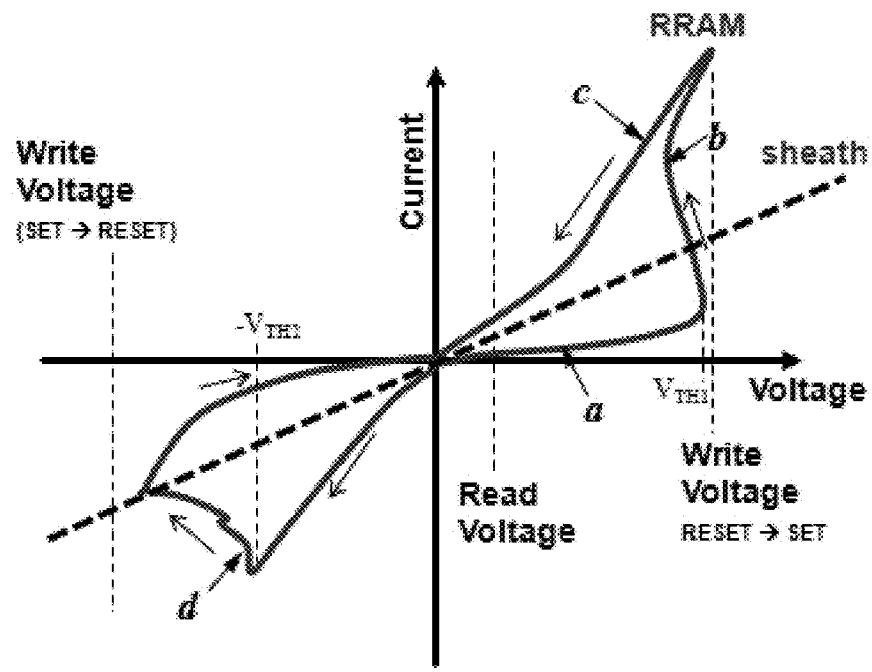
FIGS. 8a and 8b indicate electrical transport properties of elements of the FIG. 4 cell according to an embodiment of the present invention. More specifically.
Figure 8B:
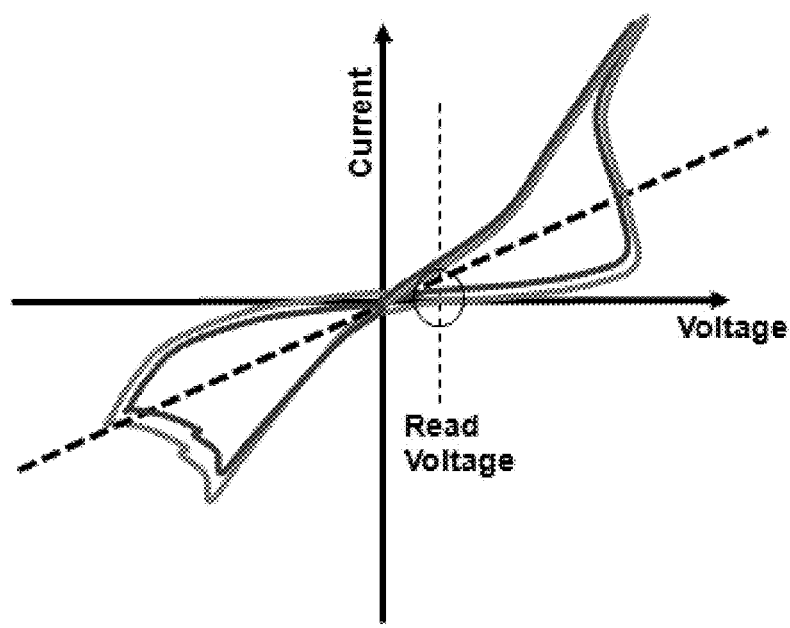

FIG. 8*a* is a schematic illustration of the current/voltage (and hence resistance) characteristics of the material components of a typical cell 10. The characteristic shown corresponds to a typical bipolar RRAM cell in which switching direction depends on polarity of the applied voltage. However, the basic principle to be described can be applied equally to unipolar/non-polar RRAM cells as is readily apparent to those skilled in the art. The solid line indicates variation of current with voltage for the RRAM core component. This shows a non-linear characteristic with a field-induced threshold switching or dielectric breakdown phenomenon. As the applied voltage (positive polarity) is increased from zero with the cell initially in the RESET state (e.g. right-hand diagram in FIG. 6), the cell current increases along section a of the curve until a positive threshold voltage $V_{TH1}$ is reached. The cell then switches (section b of the curve) to the low-resistance SET state in which the conductive path connects the electrodes (left-hand diagram in FIG. 6). As the applied voltage is then reduced to zero and increased with negative polarity, the cell current tracks section c of the curve until a negative threshold voltage $-V_{TH2}$ is reached. The cell then switches again (section d of the curve) back to the high-resistance RESET state, returning to section a of the curve as the voltage is increased in a positive direction again. As indicated in the figure, the cell read voltage is selected to be sufficiently low as to avoid disturbing the programmed cell state. The cell programming (write) voltage is selected to be above the appropriate threshold voltage to achieve the desired cell state. By varying the magnitude and/or duration of the RESET-SET programming pulse, the cell can be set to the "intermediate" high-resistance states (e.g. as in the middle two diagrams of FIG. 6). In each of these intermediate states, the characteristic current/voltage curve is similar to that shown but modified in view of the different cell-resistance. This is illustrated in FIG. 8*b* which shows characteristic curves for two different cell states. The cell current at the read voltage is different for the different cell states, permitting read detection as discussed earlier.

It can be seen from FIG. 8*a* that there is a large (typically 3 orders of magnitude) variation in resistivity between the RRAM matrix (corresponding to section a of the curve in the RESET state) and the conductive path (corresponding to section c of the curve in the SET state). The dashed line in the plot indicates the (here ohmic) characteristic for the sheath 15. It can be seen that, at low voltages including the cell read voltage, the resistance of sheath 15 is between that of the matrix and the conductive path. The resulting current flow during a read operation is thus as indicated in FIG. 7. The cell write voltage is selected to be above the threshold switching voltage discussed above. At this voltage, the cell resistance corresponds to that of the conductive path and is much less than that of sheath 15. The write-current is thus substantially unaffected by presence of sheath 15 as indicated in FIG. 7.

Based on the above principles, preferred cell arrangements are such that at the cell read voltage, the resistance $R_{ec}$ of the electrically-conductive component is far from both the resistance $R_M$ of the RRAM matrix in the RESET cell state and also the resistance $R_P$ of the conductive path in the SET state (where "far" here means far within the context of the resistance range from $R_M$ to $R_P$). In general, an appropriate value for $R_{ec}$ in this range depends on various factors, such as the materials and dimensions of cell components, the particular characteristics of the s programmable cell states, the operating parameters (e.g. read and write voltages) of memory device 1 as well as desired performance criteria such as maximum acceptable error-rate. In general, however, the arrangement is preferably such that $R_{ec} \gg R_P$ and $R_{ec} \ll R_M$ within the context of the aforementioned range.

Figure 9:
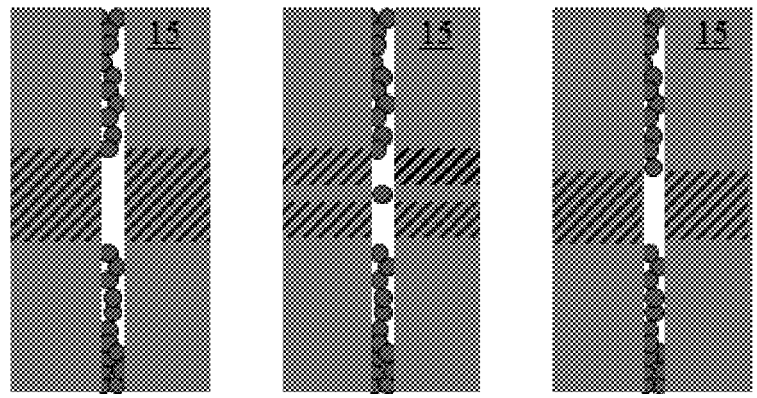
FIG. 9 illustrates differentiation of high-resistance cell states according to an embodiment of the present invention.

Due to the resistance characteristics described above, the programmed state of cell 10 can be considered to be projected onto the resistance of sheath 15 in a read operation, as the length l of the current path through the sheath reflects the conductive path length and hence the programmed state. The resistance information is thus effectively stored in sheath 15 and resistance of the RRAM matrix is no longer used to differentiate cell states. In effect, therefore, the arrangement provides full decoupling of the path-formation operation and the information storage/readout task. FIG. 9 illustrates this effect for three different cell states with slightly different conductive path lengths. The shading on sheath 15 in each case indicates regions where the read current flows primarily through the sheath. The cell resistance in these states is much lower than that of conventional cells. Since the path configuration is projected onto resistance of the sheath, the differences in these states, which are beyond the limits of detection with conventional resistance measurement circuits, can be readily resolved. In addition, the effect of resistance drift in the RRAM matrix on cell read operations is significantly reduced. This is because the cell current flows mainly through conductive path 14 and sheath 15 which do not exhibit drift. The sheath 15 provides a full parallel current path between electrodes 12, 13 providing drift-resistant operation over the entire operational range. Moreover, any residual drift effect (due to the very small current flowing through matrix 11) will exhibit low variability between different cell states since the parallel current path ensures that current through component 15 is always dominate.

The design of cell 10 also allows the volume of the RRAM matrix to be significantly reduced without compromising overall resistance of the cell. The matrix can have an elongated shape so that the extent of the matrix in a direction between the electrodes is greater than the thickness of the matrix perpendicular to this direction. In general, the matrix volume can be arbitrarily small, while the RESET resistance can be made arbitrarily large. In particular, the resistivity of the matrix can be increased to achieve a lower RESET current and reduce power consumption. In addition, noise associated with resistance of the matrix can be heavily masked by the electrically-conductive component. In general the material and geometry of the electrically-conductive component can be selected to have desirable properties. The volume of sheath 15 is significantly greater than that of the RRAM core in this example and encapsulation of the RRAM core in the sheath provides shielding for the core. The sheath can thus provide a thermal barrier and heat sink, reducing likelihood of thermal disturb, and the presence of the sheath coupled with reduced matrix volume allows adequate distance to be maintained between RRAM elements even with much smaller cell-spacing.

Figure 10:
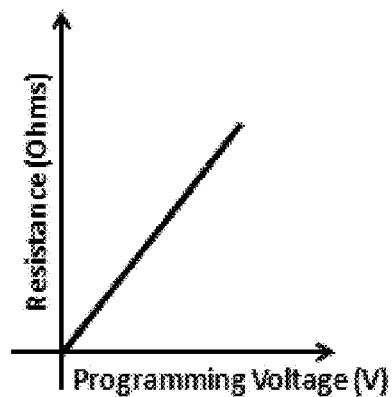
FIG. 10 shows a programming curve for the FIG. 4 cell according to an embodiment of the present invention.

FIG. 10 is a schematic representation of a programming curve (indicating variation of cell resistance with programming (write) voltage) for the above cell assuming that sheath 15 is of uniform resistivity. As conductive path length decreases with increasing programming voltage in this illustration, the resulting cell resistance increases accordingly, giving the linear programming curve shown. In other RRAM cells embodying the present invention, however, the resistance per unit length of the electrically-conductive component is not uniform, but varies in a direction between the electrodes so as to provide a desired cell operating characteristic. Examples of such RRAM cells is described with reference to FIGS. 11a-17.

Figures 11A, 11B:
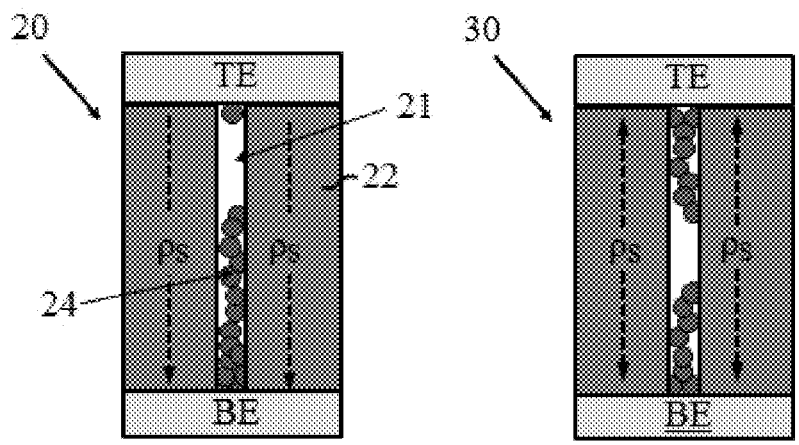
FIGS. 11a and 11b illustrate modified RRAM cells according to embodiments of the present invention. More specifically.

FIG. 11a is a schematic cross-sectional view of another RRAM cell embodying the present invention. The cell 20 is broadly similar to cell 10 of FIG. 4, having an RRAM matrix core 21 within an electrically conductive sheath 22 which extends from a bottom electrode BE to a top electrode TE. In cell 20, however, the conductive path grows substantially from the bottom electrode towards the top electrode. This can be achieved by appropriate engineering of the cell as discussed earlier. The resistive properties of elements of cell 20 conform to the basic requirements discussed above for cell 10, whereby operation of cell 20 is broadly as described with reference to FIGS. 7 and 8. In addition, however, the resistivity $\rho_S$ of the material forming sheath 22 varies over the length of the sheath, increasing generally monotonically from the top electrode towards the bottom electrode as indicated by the arrows in the figure. As a result, the resistance per unit length of the sheath 22 varies in the direction of the current path through the sheath material. Specifically, the resistance per unit length increases in the direction of increasing length of the current path through the sheath. This corresponds to decreasing length of the conductive path through the RRAM matrix, and hence higher cell resistance. FIG. 11b shows the corresponding arrangement for a cell 30 in which the conductive path grows similarly from each electrode towards the other. In this case, the resistivity $\rho_S$ of the sheath material increases from a middle section of the sheath towards both electrodes.

Figure 12:
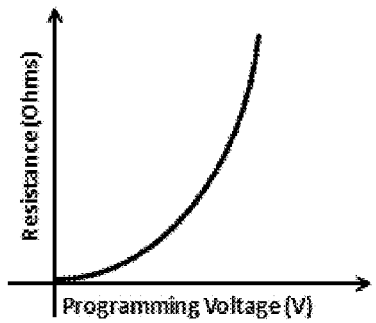
FIG. 12 shows a modified form of a programming curve for the cells of FIGS. 11a and 11b according to an embodiment of the present invention.

The effect of the variation in resistance per unit length in FIGS. 11a and 11b is to modify the cell programming curve generally as indicated in FIG. 12. Compared to the linear relation of FIG. 10, a higher-resistance state is achieved for a given programming voltage, the resistance difference increasing with increasing programming voltage. In effect, therefore, the cell resistance for the higher-resistance cell states is increased, enhancing the overall resistance contrast and providing increased programming range. This effectively increases the programming space available for resistance levels corresponding to different cell states, facilitating discrimination of different cell states on readback and/or permitting storage of more levels per cell.

The particular values and variation of the resistivity $\rho_S$ can be selected as required in a given cell structure to achieve a desired operational characteristic, e.g. a desired programming range, and/or desired resistance values for particular programmed cell states, and/or a programming curve of a desired shape. Appropriate values and ranges depend on various factors, such as the particular materials and dimensions of elements of the cell structure, desired characteristics of the s programmable cell states, the operating parameters (e.g. read and write voltages) of memory device 1 as well as desired performance criteria such as maximum acceptable error-rate. Appropriate parameters in a given scenario are readily apparent to those skilled in the art. In some embodiments, the resistivity $\rho_S$ of the sheath material might vary from a value close to that of the conductive path to a value close to that of the insulating matrix (subject to the general resistance requirements described earlier). The term "close" here means close within the context of the range (typically spanning several orders of magnitude) from the resistivity $\rho_P$ of the conductive path to the resistivity $\rho_M$ of the matrix.

RRAM cells 20, 30 can be fabricated using standard processing techniques. For example, the bottom electrode can be formed first on an insulating substrate using standard deposition and lithography techniques. A layer of sheath material can then be deposited on the bottom electrode, with the resistivity of the layer being gradually varied during the deposition process. For example, the conductive sheath can be formed of TaN or another metal nitride, in which case the flow rate of nitrogen gas over the structure can be gradually varied during the deposition of the TaN layer to achieve the desired variation in resistivity. In an another embodiment, for instance, the sheath 15 can be formed of a doped semiconductor material, e.g. doped silicon and the resistivity variation can be achieved by varying the doping level during deposition. In any case, the resulting layer can then be etched to remove the core area and define the sheath. The sheath can then be used to lithographically define the RRAM core component element during deposition of the insulating matrix. In general, however, the various elements of cells embodying the invention can be formed in any desired manner and in any convenient order to give the required arrangement, and suitable processes and techniques are readily apparent to those skilled in the art.

Figure 13:
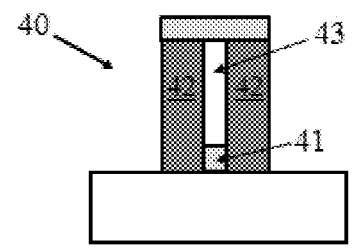
FIGS. 13 to 16 illustrate further RRAM cells according to embodiments of the present invention.

The variation in sheath resistivity can be substantially continuous or can be graduated in some embodiments. A further modification is illustrated in FIG. 13. The structure of this cell 40 corresponds generally to that described above, but the bottom electrode 41 is confined within the sheath 42 to the lateral dimensions of the RRAM core 43. This arrangement can promote growth of the conductive path from the bottom to the top electrode in some implementations. Fabrication can also be simplified since the sheath can be formed directly on the insulating substrate and used for patterning of both the bottom electrode and the RRAM core.

Figure 14:
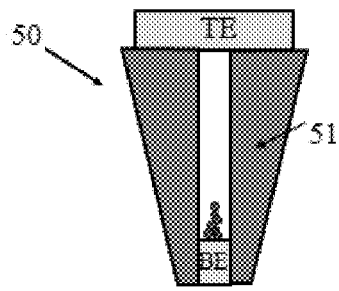

FIG. 14 is a schematic cross-sectional view of another RRAM cell embodying the invention. This cell 50 is adapted to operate generally as cell 20 above and only the key differences are discussed in the following. In cell 50, the diameter of the sheath 51 decreases in a direction from the top electrode to the bottom electrode. The resistivity $\rho_S$ of the sheath is substantially uniform in this example. However, the decreasing sheath diameter causes the resistance per unit length of the sheath to increase with increasing length of the current path through the sheath. Thus, the shape variation results in similar modification of the programming curve as the resistivity variation in cell 20. As before, the particular geometric and material parameters in this embodiment can be selected to provide a desired cell characteristic. Other sheath shapes and shape-variations can of course be envisaged, e.g. a step-wise variation or a bi-directional variation for a bi-directional conductive path growth, and a combination of shape and resistivity modulation can be employed if desired. The required shape of the sheath can be produced in any convenient manner, for example by using appropriately shaped spacers during deposition of the sheath material.

Figure 15:
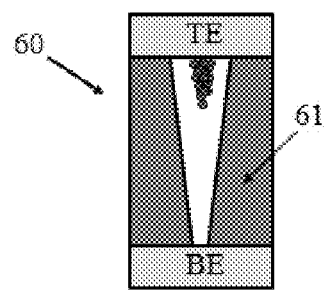

An alternative cell design, which is based on the same principles as cell 50 and is particularly easy to fabricate, is illustrated in FIG. 15. In this cell 60, the shape variation is achieved by increasing the inner diameter of sheath 61. The outer sheath diameter remains constant. This structure can be readily achieved using a removable spacer, or former, to define the core region during deposition of the sheath material. After removal of the spacer, the resulting bore in the sheath defines the pattern for formation of the core on subsequent deposition of the matrix material. In this embodiment, therefore, the core thickness (here diameter) increases in the direction in which the sheath thickness decreases. However, operation is substantially the same as in the above embodiment where the core diameter is substantially uniform along its length.

Figure 16:
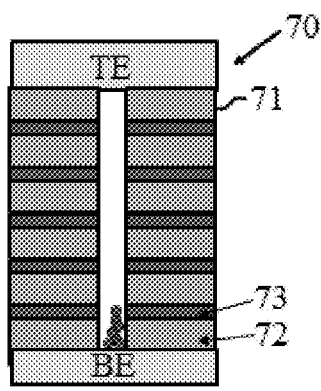

FIG. 16 is a schematic cross-sectional view of another RRAM cell embodying the invention. This cell 70 again conforms to the general operating principles discussed above and only the key differences are be described below. In this design, the sheath 71 includes alternating first and second sections, 72 and 73 respectively, in a direction between the electrodes. The first sections 72 are of lower resistance than the second sections 73. In this preferred embodiment, the second sections 73 are of smaller thickness than the first sections 72. The first sections 72 also have a lower resistivity $\rho_{S_1}$ than the resistivity $\rho_{S_2}$ of the second sections 73.

Figure 17:
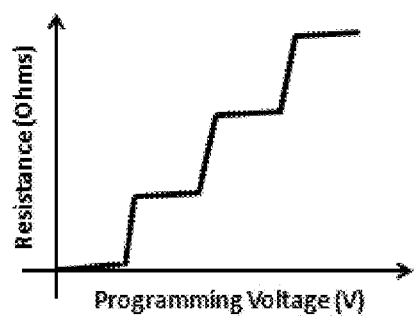
FIG. 17 shows a programming curve for the FIG. 16 cell according to an embodiment of the present invention.

FIG. 17 indicates the effect on the programming curve of this modulation in the resistance per unit length of sheath 71. The curve has a stepped shape, with the steeper sections corresponding to respective higher-resistance layers 73 and the flatter sections corresponding to the lower-resistance layers 72. This type of stepped programming curve provides an excellent mechanism for defining and differentiating multiple cell levels corresponding to different programmable states. The steps can be adapted such that each step, and specifically the flat, top section of the step, corresponds to a respective programmable cell state. The measured cell resistance varies little over the range of programming voltages corresponding to this section, giving well-defined resistance levels for each cell state. In addition, the resistance levels corresponding to different cell states are well separated due to the steep side-sections of the steps. This cell design thus provides an elegantly simple mechanism for clearly differentiating different programmed cell states. This both facilitates read detection and offers fast, accurate write programming. In particular, such multilevel cells are especially amenable to so-called "single-shot programming", whereby a required cell-state is achieved using a single programming pulse. This contrasts with iterative programming techniques which use a series of programming pulses, with intervening read operations, to gradually converge on the required state.

Subject to the general resistance requirements described earlier, the first sections 72 preferably have a resistivity close to the resistivity $\rho_P$ of the conductive path and the second sections 73 preferably have a resistivity close to the resistivity $\rho_M$ of the insulating matrix, in order to enhance the stepped structure of the programming curve. (Again, the term "close" here should be construed in the context of the large resistivity range from $\rho_P$ to $\rho_M$). If the second sections 73 are of sufficiently small thickness, the resistivity of these sections can be sufficiently close as to be approximately equal to $\rho_M$.

RRAM cell 70 can be fabricated generally as described earlier, varying the resistivity of the sheath material layer-by-layer during deposition and the various materials, dimensions, and other parameters can be selected as required to give a desired shape to the programming curve. Various modifications to this design can also be envisaged. For example, the layer structure and resulting steps of the programming curve may not be entirely regular, but can be adapted to particular requirements for different programming states. A similar resistivity modulation might also be achieved by modulating the thickness of the sheath, or via a combination of shape and resistivity variation.

It can be seen that, by varying the resistance per unit length of the sheath as described, the above embodiments offer highly efficient RRAM cells with significantly improved operating characteristics.

Numerous modifications to the above embodiments can be envisaged. The principles explained above relating to arrangement and resistive characteristics of the phase-change and electrically-conductive components afford superior design flexibility for RRAM cells, permitting reduction of dimensions and optimization of parameters to achieve various efficient cell designs. In general, the RRAM component can take forms other than an elongated core and can have a variety of cross-sectional shapes. The electrically-conductive component may not extend fully around the RRAM component in some embodiments. Embodiments can also be envisaged in which the electrically-conductive component does not provide a full parallel current path between the electrodes, but extends only part-way between the electrodes.

Figure 18A:
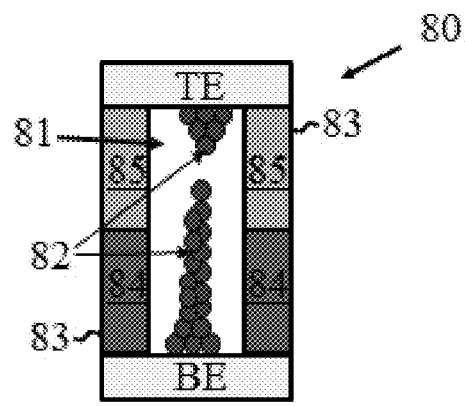
FIGS. 18a and 18b illustrate structure and operation of a complementary RRAM cell according to an embodiment of the present invention. More specifically.

Another advantageous cell design is illustrated in FIG. 18a. This cell 80 is generally similar to cell 10 of FIG. 4, having an RRAM matrix core 81, containing conductive path 82, within an electrically conductive sheath 83 which extends from a bottom electrode BE to a top electrode TE. In this design, however, the resistance per unit length in a direction between the electrodes of the electrically-conductive component is greater near the first electrode than near the second. In the example shown, the sheath 83 includes a first section 84 near the bottom electrode and a second section 85 near the top electrode, the first section having a higher resistivity than the second section. This structure provides an improved complementary cell design. The complementary cell operation can be understood from FIG. 18*b*. By application of a write voltage of one polarity to the cell, a first high-resistance state can be obtained in which the conductive path has a longer portion near the bottom electrode than the top electrode. This state is shown schematically on the left of FIG. 18*b*, labeled "RESET state 1". As the applied voltage is increased in magnitude with the aforementioned polarity, the cell eventually switches to the first SET state as represented by the second diagram in FIG. 18*b*. By application of a voltage of the opposite polarity, the cell can then be made to switch to a second high-resistance state, indicated as "RESET state 2" in the figure. In this state, the conductive path has a longer portion near the top electrode than the bottom electrode. The cell can be switched back to the SET state shown in the right of the figure by again increasing the voltage magnitude above the switching threshold for this state.

Figure 18B:
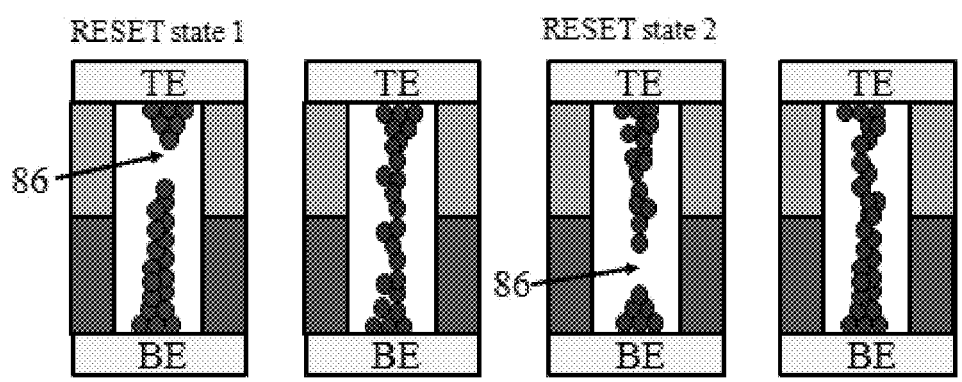

It can be seen that the high-resistance gap 86 in the conductive path is closer to one electrode than the other in each of the two RESET states in FIG. 18*b*. This difference can be detected in a read measurement because the read current flows primarily through the sheath 83, rather than the matrix material in the gap, and this component has different resistances per unit length in sections 84 and 85. The measured cell resistance differs in the two cell states. Hence, using the two RESET states as the two programmable cell states of cell 80, this cell provides a complementary single-level (two-state) RRAM cell in which the cell offers a high resistance in both programmed states. This avoids problems associated with sneak-path currents described earlier. Moreover, the cell does not require a "destructive read" to determine cell state because the two sections of conductive sheath 83 allow both states to be distinguished in a read operation without requiring threshold switching as in prior complementary cells. There is therefore no requirement for reprogramming such a complementary cell following a read operation.

In other implementations of this cell design, the different resistance per unit length at each end of the sheath can be achieved by varying the shape, in particular the thickness, of the sheath instead of (or in addition to) the resistivity.

As an alternative, a three-state RRAM cell can be based on the above complementary cell arrangement. Such a cell can adapted for storing information in the first and second RESET states described above, and also a SET state in which the conductive path connects the electrodes.

Figure 19:
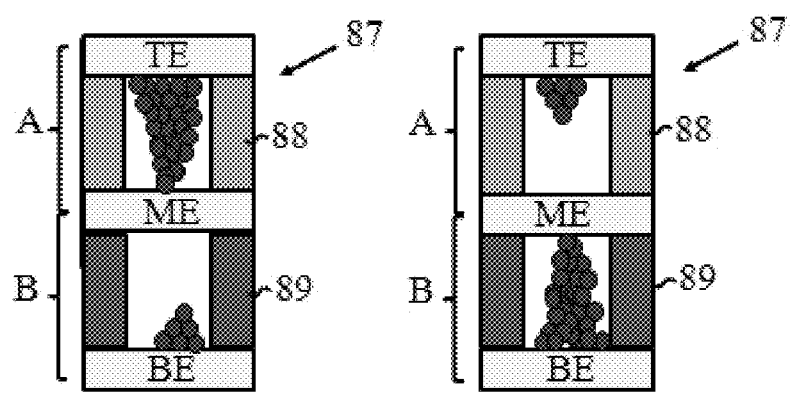
FIG. 19 illustrates structure and operation of an alternative complementary cell according to an embodiment of the present invention.

Another embodiment of a complementary cell is illustrated in FIG. 19. This structure includes two stacked RRAM cells, each of which is generally similar to cell 10 of FIG. 4, and which together form a composite complementary cell 87. The two RRAM cells, labeled A and B in the figure, each have an RRAM matrix core, in which a conductive path can be formed, within an electrically-conductive sheath 88, 89 extending between a pair of electrodes. The cells are connected antiserially and share a common electrode so that the resulting complementary cell structure has a top electrode TE, a middle shared electrode ME, and a bottom electrode BE. The electrically-conductive sheaths 88, 89 of the two RRAM cells have different electrical resistance. In this example the resistance difference is achieved by use of sheath materials with different resistivity as indicated by the different shading in the figure. Due to the antiserial connection of cells A and B, application of a write voltage of one polarity between electrodes TE and BE can cause cell B to adopt a high-resistance state while cell A remains in a low-resistance state. The resulting state of the complementary cell is indicated on the left of FIG. 19. By application of a write voltage of the opposite polarity, this configuration can be reversed whereby cell A assumes a high-resistance state while cell B assumes a low-resistance state. This complementary cell state is shown on the right of the figure. The two complementary cell states shown are both high-resistance states, allowing problems associated with sneak-path currents to be avoided. Moreover, the two complementary cell states can be differentiated because the read current flows primarily through the sheath 88, 89 of whichever cell A, B is in the high-resistance state and these sheaths have different resistance. The overall resistance of the complementary cell differs in the two cell states, whereby the cell can be read without destroying the programmed state.

In a modification of this complementary cell design, the different sheath resistance can be achieved by varying the geometry, in particular the thickness, of the sheaths 88, 89 instead of (or in addition to) the resistivity.

FIG. 20 illustrates another advantageous cell design employing the principles described above. In this "lateral" design, the cell 90 has a layer 91 of RRAM matrix material. Matrix layer 91 extends between two electrodes implemented by layers 92 formed on an insulating substrate 93. The electrically-conductive component is formed by a layer of electrically-conductive material 94 formed on substrate 93 and extending from one electrode 92 to the other. The electrically-conductive layer 94 is in contact with the lower surface of the overlying matrix layer 91. The conductive layer 94 in this example has a volume similar to that of matrix layer 91. The thickness of conductive layer 94 is approximately equal to, or greater than, that of the matrix layer in this example. By way of illustration, matrix layer 91 can have a thickness in the range of about 1 to 50 nm, and preferably about 1 to 10 nm. The electrically conductive layer 94 can be formed, for example, of TaN or TiN. This layer can have a thickness in the range of about 1 to 50 nm, and preferably about 1 to 10 nm.

Such lateral cell designs involving deposition/patterning of material layers are particularly simple to fabricate using standard material processing techniques. Filling of high-aspect-ratio trenches is not required and dimensions can be easily adjusted (e.g. to achieve very small cell volume or other desired properties). As a further simplification, in some implementations the electrically-conductive component can be formed of the same material as at least one of the electrodes. The electrode(s) can thus be integrally formed with the electrically-conductive component as a single layer of electrically-conductive material.

The resistance per unit length along conductive layer 94 in FIG. 20 can be varied in a similar manner to the earlier embodiments, thereby providing a desired cell characteristic. Hence, the resistivity of the material can be varied in a direction between the electrodes and/or the shape of the layer can be varied in this direction. For example, though shown as rectangular layers in the figure, the width (into the page) of conductive layer 94 and matrix layer 91 can decrease from one electrode towards the other to achieve operation similar to cell 50 above. Alternatively, for example, the structure can include alternating sections of higher and lower width or resistivity in a direction between the electrodes to achieve operation similar to cell 70 above. Again, various modifications can be envisaged, e.g. as discussed for earlier embodiments.

Cell designs embodying the invention offer particularly simple fabrication of RRAM memory cell arrays. For example, an array structure based on RRAM cells embodying the invention is illustrated schematically in FIG. 21. This is a partially cut-away perspective view of part of an array of cells 100. Each cell 100 has a layer of RRAM matrix material 101 beneath a top electrode layer 102. The layers 101 and 102 of cells 100 are embedded in a matrix of electrically-conductive material 103. This conductive matrix provides both the bottom electrode for each cell and also the electrically-conductive component of each cell. Although shown cut-away in this figure, the conductive matrix 103 can extend up the sides of cells 100 to contact the top electrode 102 of each cell. The resistivity of this conductive matrix can be varied along a direction towards top electrodes 102 to provide a variation in resistance per unit length as described above. As can be apparent to those skilled in the art, individual cells can be isolated for addressing purposes by any convenient mechanism (e.g. using access devices associated with respective cells which are connected between the word and bit lines of the array).

FIG. 22a is a schematic cross-sectional view of a further RRAM cell embodying the invention. The cell 110 has an RRAM insulating matrix 111 located between top and bottom electrodes 112, 113. The insulating matrix 111 is shown containing conductive path 114 and includes opposed layers 116a, 116b, seen in cross-section in the figure, of the matrix material. These opposed layers 116a, 116b extend in a direction between the electrodes 112 and 113 and are substantially parallel with one another in this embodiment. The cell includes a core member 117 which extends in a direction between the electrodes in contact with the inner, facing surfaces of opposed matrix layers 116a, 116b. The cell also has an outer member 118 which extends in a direction between the electrodes in contact with the outer (outwardly-facing) surfaces of opposed layers 116a, 116b. The inner and outer members 117, 118 are both formed of electrically-conductive material in this embodiment. This cell 110 also has a surrounding insulating layer 119.

FIG. 22b is a schematic cross-section on A-A in FIG. 22a. As can be seen in this figure, the opposed layers 116a, 116b of RRAM matrix component 111 are integrally-formed in this embodiment, joining to form an annulus around the core member 117. The annulus has a substantially circular cross-section in this example, whereby opposed layers 116a, 116b constitute respective sides of a substantially cylindrical annulus of matrix material. The core member 117 and outer member 118 have circular cross-sections conforming to RRAM component 111. Referring again to FIG. 22a, the RRAM component 111 also has a base layer 120, located between bottom electrode 113 and the proximal end of core member 117, joining the opposed side layers 116a, 116b. The cylindrical annulus of RRAM component 111 is closed at one end by base layer 120 (The term "base" is used herein without implied limitation as to cell orientation). Core member 117 forms an elongated core of electrically-conductive material extending over the majority of the distance between electrodes 112, 113 inside RRAM annulus 111. The outer member 118 is formed here by a layer of electrically-conductive material which extends from one electrode to the other on the outside of RRAM annulus 111.

The opposed RRAM layers 116a, 116b can typically have a thickness in the range of about 1 to 50 nm, and preferably about 1 to 10 nm. The core member 117 can typically have a thickness (here diameter) in the range of about 1 to 20 nm, and preferably about 1 to 10 nm. The outer component 118 can typically have a thickness in the range of about 1 to 50 nm, and preferably about 1 to 10 nm. By way of example, the core and outer members can be formed of TaN or TiN and insulating layer 119 can be formed of silicon dioxide.

Since the core and outer members 117, 118 are both formed of electrically-conductive material in this embodiment of the present invention, these members collectively provide the electrically-conductive component in this cell design. These members satisfy the resistance requirements described earlier, whereby the current-flow in each of the opposed side layers 116a, 116b of the RRAM annulus 111 is generally as illustrated in FIG. 7. This design provides the various advantages described earlier and permits dramatic reduction in volume of the RRAM matrix. Moreover, a major advantage of this cell design is that it is very easy to fabricate, even with the reduced dimensions envisaged for these cells. Basic steps of one exemplary fabrication process for cell 110 are described below.

Figure 23A:
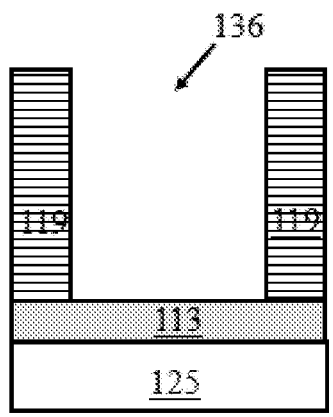
FIGS. 23a-23e illustrate successive stages in a fabrication process for the cell of FIG. 22a according to an embodiment of the present invention.
Figure 23B:
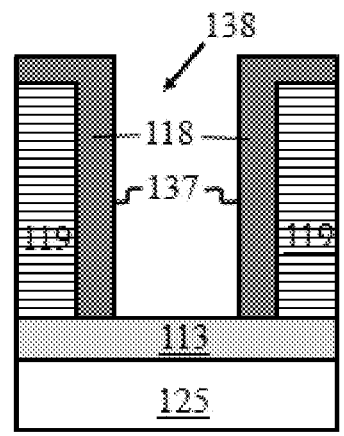
Figure 23C:
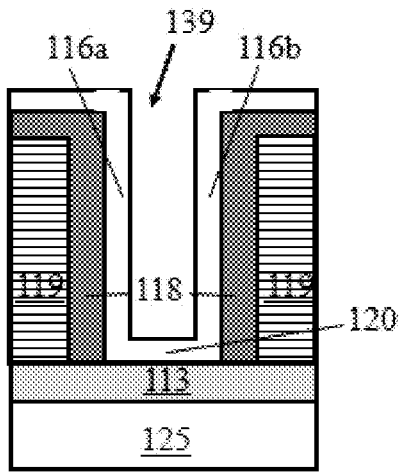
Figure 23D:
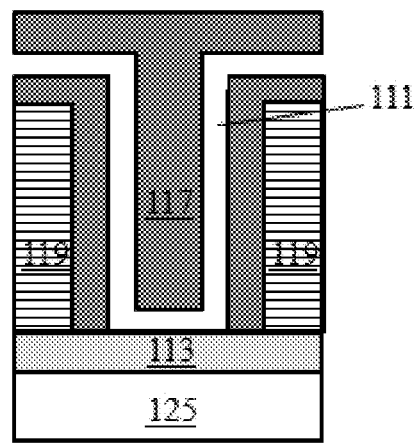
Figure 23E:
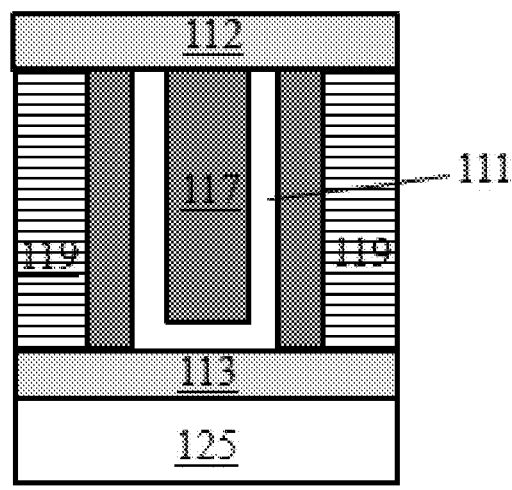

FIGS. 23a-23e are schematic cross-sectional views through the cell structure in successive stages of the fabrication process. Using standard deposition and lithography techniques, bottom electrode 113 is first formed on an insulating substrate 125. A layer of silicon dioxide 119 is subsequently deposited on electrode 113 and a trench 136 is etched in this layer as shown in FIG. 23a. For this particular cell design, the trench 136 has the form of a cavity which is substantially cylindrical (within tolerances inherent in the fabrication process). Next, as shown in FIG. 23b, a layer of TaN is deposited as a conformal layer in cavity 136. The base portion of this TaN layer is removed to form outer member 118. This component has opposed surfaces 137 which again define a trench in the form of a substantially cylindrical cavity 138. Next, a layer of RRAM insulating matrix material is deposited as a conformal layer in cavity 138 such that the opposed layers 116a, 116b are formed in contact with the opposed surfaces 137 of outer member 118 and base layer 120 contacts bottom electrode 113. The resulting matrix layer then defines a further substantially cylindrical cavity 139 as shown in FIG. 23c. Next, as illustrated in FIG. 22d, a further TaN deposition step is performed to form the core member 117 in cavity 139 in contact with respective inner surfaces of opposed matrix layers 116a, 116b. Finally in this embodiment, the remaining layer structure above the top of silicon dioxide layer 119 is removed, by etching and/or polishing steps, and the top electrode 112 is formed by deposition and patterning of a further layer (FIG. 23e).

The various cell components are easily fabricated by the simple process above in spite of the small cell dimensions. There is no need to fill high-aspect ratio trenches with the RRAM matrix material. The low-volume RRAM component 111 is easily formed by a conformal layer deposition process, allowing precise control of the layer thickness and matrix volume. Thus, trenches need not be completely filled with matrix material and there is no need to compromise on material composition or risk problems associated with formation of voids.

Various modifications can be made to the foregoing cell design and fabrication process. For example, embodiments can be envisaged in which the fabrication process is simplified by omitting the step of FIG. 23e described above. That is, the cell can have the structure illustrated in FIG. 23d. In this case, the overlying TaN layer can provide the top electrode for the cell, or the top electrode can be formed as an additional layer on the TaN layer. The matrix layer which then remains interposed between the top of outer member 119 and the overlying TaN layer can have little material effect in operation of such structures, particularly due to the low thickness envisaged for the matrix layer. In another modified cell design, the matrix base layer 120 can be removed (e.g. by etching) between FIGS. 23c and 23d of the fabrication process. Also, the base of the conductive layer deposited in FIG. 23b to form outer member 118 may not be removed in some embodiments. In other variants of this cell design, only one of the core member and outer member can be formed of electrically-conductive material, the other member being an insulator. For example, the core member can be formed of electrically-conductive material and the outer member can be an insulator selected to provide enhanced electrical and thermal insulation for the cell. In other embodiments, however, only the outer member can be electrically-conductive. Whichever member is conductive, resistance requirements discussed earlier apply to this member to provide functionality of the electrically-conductive component described above.

An alternative fabrication process can build the cell structure from the core out. That is, the core member can be formed first on top of one electrode on a substrate. The core member can, for example, include a nanotube. The RRAM component can then be formed by conformal layer deposition on the core member to form an annulus around the core. The outer member can then be formed by conformal layer deposition over the RRAM matrix. A surrounding layer of insulating material and the second electrode can then be formed on this structure.

Figure 24:
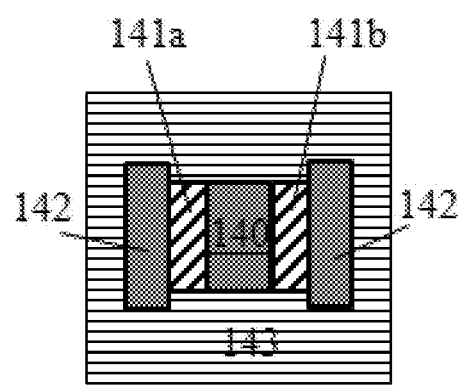
FIG. 24 illustrates a modified form of the cell of FIG. 22a according to an embodiment of the present invention.

While the cell components have a generally circular cross-section in the above embodiment, these components can have any convenient cross-sectional shape. Moreover, while opposed RRAM layers 116a, 116b join laterally to define an annulus above, these layers may not be integrally formed in some embodiments. FIG. 24 is a schematic cross-sectional view, similar to FIG. 22b, of an exemplary cell structure illustrating this modification. The perpendicular cross-section of this cell structure is generally similar to that of FIG. 22a and only the key differences are described here. The cell has a core member 140 of rectangular cross-section in contact with respective inner surfaces of opposed RRAM matrix layers 141a, 141b. These layers are provided only on opposite sides of the core 140 and do not join together to form an annulus around the core. An outer member 142 is provided on both sides of the structure in contact with respective outer surfaces of the opposed layers 141a, 141b. The cell structure is surrounded by insulating material 143. Such a cell structure can be achieved, for instance, via a process similar to that illustrated in FIGS. 23a to 23e but in which the TaN and matrix layers are deposited in a localized region of an elongated trench (extending into the page in FIG. 23a) in the insulating material 119. Other fabrication processes can of course be envisaged, including modifications as described earlier. In general, the various elements of RRAM cells embodying the invention can be formed in any desired manner and in any convenient order to give the required arrangement.

While examples of preferred cells structures have been described, the particular dimensions and relative sizes of cell components in embodiments of the invention can vary (subject to the resistance requirements discussed above) for different RRAM cell types and depending on the particular choice of materials. In general, however, the insulating matrix has an elongated shape in preferred embodiments so that the extent of the matrix in a direction between the electrodes is greater than the thickness of the matrix perpendicular to this direction. For most effective operation, by appropriate choice components, materials, dimensions, etc., the cell arrangement is preferably such that the conductive path occupies at least about 10% and most, preferably the majority, of the thickness of the insulating matrix perpendicular to a direction between the electrodes. In the preferred embodiments with particularly small matrix volumes, the conductive path can have a similar "width" (i.e. thickness perpendicular to a direction between the electrodes) to the matrix, e.g. at least about 80% of the matrix width in said direction. In general, however, the relative widths of the matrix and conductive path can become less important as the length of the matrix volume increases in a direction between the electrodes and particular cell designs can be adapted accordingly. The thickness of the matrix perpendicular to a direction between the electrodes need not be constant and can vary considerably for different RRAM cells based on the switching mechanism. However, this dimension might typically be less than about 100 nm and can be less than about 20 nm in some cells. In preferred designs, the volume of the electrically-conductive component is greater than about half that of the matrix and is preferably similar to or exceeds the volume of the matrix. The thickness, perpendicular to a direction between the electrodes, of the electrically-conductive component is typically greater than about half that of the matrix and can be about equal to, or preferably greater than, that of the matrix.

In general, the electrically-conductive component can be formed of any suitable material. Examples of such materials include metal nitrides such as TiN, TiAlN, TaN, BN, metal oxide nitrides such as TiON, metal silicides such as PtSi, semiconductors such as silicon or germanium (with and without doping), reduced metal oxides such as TiOx (x<2 indicates reduction), metals such as W, Ni, Co, or carbon based materials.

In the preferred embodiments above, the resistance presented to a read current by the electrically-conductive component is greater than that of the conductive path and less than that of the insulating matrix in any programmed cell state. Some advantage can still be envisaged, however, in embodiments where the resistance presented by the electrically-conductive component is the same as (or even slightly less than) that of the conductive path or is the same as (or even slightly greater than) that of the insulating matrix. In general, therefore, the resistance presented to a read current should be at least about that of the conductive path and at most about that of the insulating matrix.

While the features described are particularly advantageous for multi-level cells, these features can also be applied to advantage in single-level cells in some embodiments.

In general, modifications described for one embodiment can be applied to another embodiment as appropriate.

Many other changes and modifications can be made to the exemplary embodiments described without departing from the scope of the invention.

We claim:

1. A RRAM cell for storing information in a plurality of programmable cell states, the RRAM cell comprising:
   an electrically-insulating matrix located between a first electrode and a second electrode such that an electrically-conductive path, extending in a direction between said electrodes, is formed within said matrix on application of a write voltage to said electrodes; and
   an electrically-conductive element in contact and extending between the first electrode and the second electrode;
   wherein a resistance is presented by said electrically-conductive component; and
   wherein said RRAM is arranged such that said resistance is at least about that of said electrically-conductive path and at most about that of said electrically-insulating matrix in any of said plurality of programmable cell states.

2. The RRAM cell according to claim 1, wherein a length of said insulating matrix in said direction between said electrodes is greater than a thickness of said matrix perpendicular to said direction.

3. The RRAM cell according to claim 1, wherein said RRAM cell is arranged such that said electrically-conductive path occupies at least about 10% of said thickness of said matrix perpendicular to said direction between said electrodes.

4. The RRAM cell according to claim 1, wherein said component comprises a layer of electrically-conductive material; and
wherein said layer of electrically-conductive material is disposed on one surface of said layer of insulating matrix.

5. The RRAM cell according to claim 1, wherein said component forms a sheath around said insulating matrix.

6. The RRAM cell according to claim 5, wherein said matrix forms an elongated core within said sheath.

7. The RRAM cell according to claim 6, wherein said elongated core comprises a nanowire of said insulating matrix.

8. The RRAM cell according to claim 1, further comprising:
an opposed layer of said insulating matrix extending in said direction between said electrodes;
a core member extending in said direction between said electrodes in contact with respective inner surfaces of said opposed layers; and
an outer member extending in said direction between said electrodes in contact with respective outer surfaces of said opposed layers;
wherein said electrically conductive component comprises at least one of said core member and said outer member.

9. The RRAM cell according to claim 8, wherein said opposed layers join to form an annulus around said core member.

10. The RRAM cell according to claim 1, wherein said plurality of programmable cell states correspond to respective different lengths of said conductive path in said matrix.

11. The RRAM cell according to claim 1, wherein the resistance per unit length of said component varies in a direction between said electrodes.

12. The RRAM cell according to claim 11, wherein the shape of said component varies in a direction between the electrodes to vary the resistance per unit length.

13. The RRAM cell according to claim 12, wherein said component forms a sheath around said insulating matrix; said matrix forms an elongated core within said sheath; and
the thickness of said core increases in a direction in which thickness of said sheath decreases.

14. The RRAM cell according to claim 11, wherein said component comprises a plurality of alternating first sections and second sections in said direction between said electrodes; and
wherein said first sections are of lower resistance than said second sections to provide a stepped programming curve for said RRAM cell.

15. The RRAM cell according to claim 1 for storing information:

in a first cell state in which the conductive path has a longer portion near said first electrode than said second electrode; and
in a second cell state in which the conductive path has a longer portion near said second electrode than said first electrode;
wherein said resistance per unit length, in said direction between said electrodes, of said component is greater near said first electrode than near said second.

16. The RRAM cell according to claim 15, wherein said component comprises a first section near said first electrode and a second section near said second electrode; and
wherein said first section has a higher resistivity than said second section.

17. The RRAM cell according to claim 15, wherein the shape of said component varies in said direction between said electrodes to vary said resistance per unit length.

18. A complementary cell comprising:
an at least two RRAM cells, wherein said at least two RRAM cells are connected antiserially and electrically-conductive components of said at least two RRAM cells have a different electrical resistance: and
wherein each said RRAM cell comprises:
an electrically-insulating matrix located between a first electrode and a second electrode such that an electrically-conductive path, extending in a direction between said electrodes, is formed within said matrix on application of a write voltage to said electrodes; and
an electrically-conductive element in contact and extending between the first electrode and the second electrode;
wherein a resistance is presented by said electrically-conductive component; and
wherein each said RRAM is arranged such that said resistance is at least about that of said electrically-conductive path and at most about that of said electrically-insulating matrix in any of said plurality of programmable cell states.

19. A memory device comprising:
a read/write controller for reading and writing data in a plurality of RRAM cells; and
wherein each said RRAM cell comprises:
an electrically-insulating matrix located between a first electrode and a second electrode such that an electrically-conductive path, extending in a direction between said electrodes, is formed within said matrix on application of a write voltage to said electrodes; and
an electrically-conductive element in contact and extending between the first electrode and the second electrode;
wherein a resistance is presented by said electrically-conductive component; and
wherein each said RRAM is arranged such that said resistance is at least about that of said electrically-conductive path and at most about that of said electrically-insulating matrix in any of said plurality of programmable cell states.

20. A method for forming a RRAM cell for storing information in a plurality of programmable cell states, the method comprising:
forming a first electrode and a second electrode having an electrically-insulating matrix located therebetween such that an electrically-conductive path, extending in a direction between said electrodes, can be formed within said matrix on application of a write voltage to said electrodes; and forming an electrically-conductive element in contact and extending between the first electrode and the second electrode;

wherein a resistance is presented by said electrically-conductive component; and wherein said RRAM is arranged such that said resistance is at least about that of said electrically-conductive path and at most about that of said electrically-insulating matrix in any of said plurality of programmable cell states.

\* \* \* \* \*